US012249481B2

(12) United States Patent
Van Gerven et al.

(10) Patent No.: US 12,249,481 B2
(45) Date of Patent: Mar. 11, 2025

(54) STAGE ANTI-FRETTING MECHANISM FOR ROLLER BEARING LIFETIME IMPROVEMENT

(71) Applicant: ASML Netherlands B.V., Veldhoven (NL)

(72) Inventors: Mark Henricus Wilhelmus Van Gerven, Eindhoven (NL); Johannes Hubertus Antonius Van De Rijdt, Gemert (NL); Michaël Johannes Christiaan Ronde, Berghem (NL); Niels Johannes Maria Bosch, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 439 days.

(21) Appl. No.: 17/535,453

(22) Filed: Nov. 24, 2021

(65) Prior Publication Data

US 2022/0084781 A1 Mar. 17, 2022

Related U.S. Application Data

(63) Continuation of application No. PCT/EP2020/063148, filed on May 12, 2020.

(30) Foreign Application Priority Data

May 24, 2019 (EP) ..................... 19176502

(51) Int. Cl.
*H01J 37/20* (2006.01)
*H01J 37/26* (2006.01)
*H01J 37/28* (2006.01)

(52) U.S. Cl.
CPC ............ *H01J 37/261* (2013.01); *H01J 37/28* (2013.01); *H01J 2237/2801* (2013.01)

(58) Field of Classification Search
None
See application file for complete search history.

(56) References Cited

U.S. PATENT DOCUMENTS 6,715,336 B1    4/2004  Xu
2004/0041101 A1* 3/2004  Akutsu ............... H01J 37/3045
                                                    250/491.1
(Continued)

FOREIGN PATENT DOCUMENTS

CN      101989050 A    3/2011
CN      107810513 A    3/2018
(Continued)

OTHER PUBLICATIONS

Notice of Reasons for Rejection issued by the Japan Patent Office in related Japanese Patent Application No. 2021-564575; mailed Dec. 6, 2022 (11 pgs.).

(Continued)

*Primary Examiner* — Eliza W Osenbaugh-Stewart
(74) *Attorney, Agent, or Firm* — FINNEGAN, HENDERSON, FARABOW, GARRETT & DUNNER LLP

(57) ABSTRACT

Systems directed to a stage apparatus in an electron beam inspection tool to inspect a sample are disclosed. The stage apparatus comprises a short stroke stage; a long stroke stage; a first sensor configured to measure a position of the short stroke stage with respect to a measurement reference; one or more roller bearings configured to support the long stroke stage; and a controller having circuitry and configured to control a motion of the long stroke stage and a motion of the short stroke stage for following movement of the reference at least partly based on measurement from the first sensor, wherein the controller is operable such that control of the long stroke stage is decoupled from the movement of the (Continued)

reference in at least a part of operation of the stage apparatus for reducing debris generation of the one or more roller bearings.

19 Claims, 10 Drawing Sheets

(56) References Cited

U.S. PATENT DOCUMENTS

| | | |
|---|---|---|
| 2005/0269525 A1 | 12/2005 | Terken et al. |
| 2013/0342827 A1* | 12/2013 | Ummethala ........ G03F 7/70716 356/498 |
| 2019/0120425 A1* | 4/2019 | Gossard .................. F16N 29/02 |
| 2019/0129317 A1 | 5/2019 | Ronde et al. |

FOREIGN PATENT DOCUMENTS

| | | |
|---|---|---|
| EP | 1577929 A2 | 9/2005 |
| JP | 2005-347756 A | 12/2005 |
| JP | 2011035392 A | 2/2011 |

OTHER PUBLICATIONS

International Search Report and Written Opinion issued in related International Application No. PCT/EP2020/063148, mailed Aug. 14, 2020 (10 pgs.).

Office Action issued by the Intellectual Property Office (IPO) in related ROC (Taiwan) Patent Application No. 109117071, issued Mar. 22, 2021 (7 pgs.).

* cited by examiner

STAGE ANTI-FRETTING MECHANISM FOR ROLLER BEARING LIFETIME IMPROVEMENT

CROSS-REFERENCE TO RELATED APPLICATIONS

This application claims priority to International Application No. PCT/EP2020/063148, filed May 12, 2020, and published as WO 2020/239426 A1, which claims priority of EP application 19176502.3 which was filed on May 24, 2019, all of which are incorporated herein by reference in their entireties.

TECHNICAL FIELD

The present description relates to a stage apparatus for an electron beam inspection apparatus configured to inspect a specimen such as semiconductor device.

BACKGROUND

In the semiconductor processes, defects are inevitably generated. Such defects may impact device performance even up to failure. Device yield may thus be impacted, resulting in increased costs. In order to control semiconductor process yield, defect monitoring is important. One tool useful in defect monitoring is an SEM (Scanning Electron Microscope) which scans a target portion of a specimen using one or more beams of electrons. Objects, such as wafers or substrates which are inspected by an inspection apparatus, such as an SEM, may be subject to positional errors, and in particular to both dynamic (e.g., vibrational) positional errors and thermal positional errors. Therefore, it may be desirable to mitigate one, or preferably both of these positional error contributors.

SUMMARY

One aspect of the present disclosure is directed to a stage apparatus, comprising: a short stroke stage; a long stroke stage; a first sensor configured to measure a position of the short stroke stage with respect to a reference arranged not on the short stroke stage and not on the long stroke stage; one or more roller bearings configured to support the long stroke stage; and a controller for controlling a motion of the long stroke stage and a motion of the short stroke stage for following movement of the reference at least partly based on measurement from the first sensor, wherein said controller is operable such that control of the long stroke stage is decoupled from said movement of the reference in at least part of operation of the stage apparatus for reducing debris generation of the one or more roller bearings.

Other aspects of the present disclosure comprise a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus, a metrology apparatus, or a vacuum apparatus, comprising the stage apparatus of the first aspect.

Further aspects, features and advantages of the disclosure, as well as the structure and operation of various embodiments of the disclosure, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated in and constitute a part of the specification, illustrate one or more embodiments and, together with the description, explain these embodiments. Embodiments of the present disclosure will now be described, by way of example, with reference to the accompanying drawings in which.

DETAILED DESCRIPTION

Figure 1A:
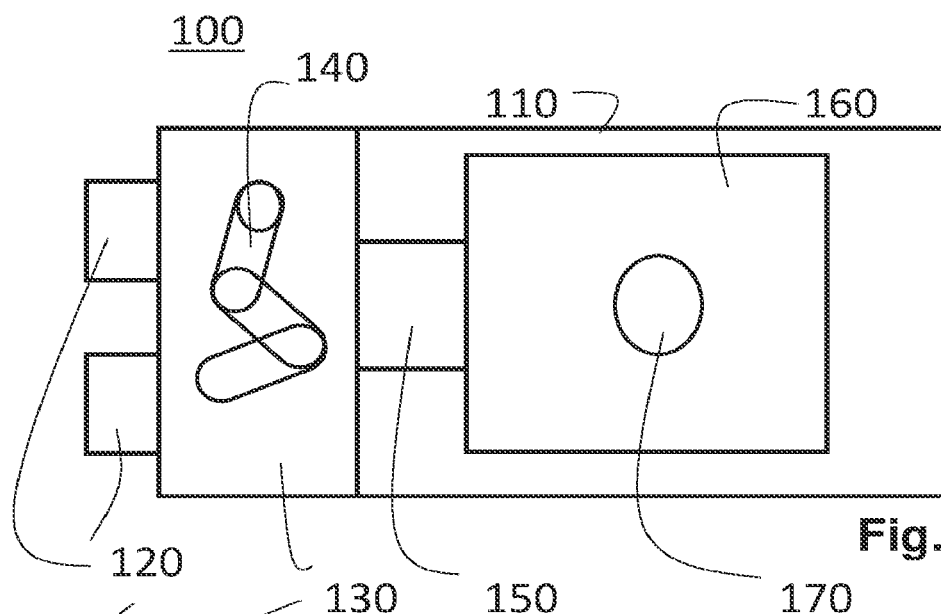
FIGS. 1A and 1B are schematic illustrations of an e-beam inspection tool, according to some embodiments of the present disclosure.

Various example embodiments of the present disclosure will now be described more fully with reference to the accompanying drawings in which some example embodiments of the disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. This disclosure, however, may be embodied in many alternate forms and should not be construed as limited to only the embodiments set forth herein.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure. Like numbers refer to like elements throughout the description of the figures.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

In some embodiments, the term "substrate" can be a wafer (as above) or a glass substrate, and he term "patterning device" can be a "reticle", which may also be called as a "mask".

In some embodiments, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

In some embodiments, the term "crossover" refers to a point where the electron beam is focused.

In some embodiments, the term "virtual source" means the electron beam emitted from the cathode can be traced back to a "virtual" source.

In some embodiments, the inspection tool according to the present disclosure relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the disclosure are capable of various modifications and alternative forms, embodiments thereof are shown by way of example in the drawings and will herein be described in detail. It should be understood, however, that there is no intent to limit example embodiments of the disclosure to the particular forms disclosed, but on the contrary, example embodiments of the disclosure are to cover all modifications, equivalents, and alternatives falling within the scope of the disclosure.

Figure 1B:
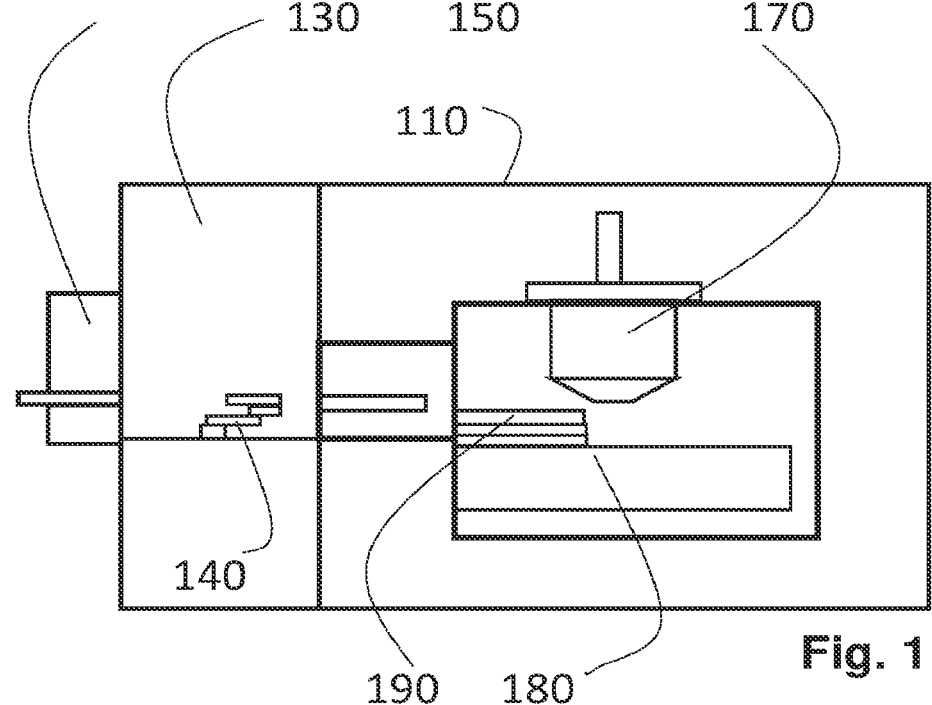

FIGS. 1A and 1B schematically depict a top view and a cross-sectional view of an electron beam (e-beam) inspection (EBI) system 100 according to some embodiments of the present disclosure. The embodiment as shown comprises an enclosure 110, a pair of load ports 120 serving as an interface to receive objects to be examined and to output objects that have been examined. The embodiment as shown further comprises an object transfer system, referred as an EFEM, equipment front end module 130, that is configured to handle and/or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170. In an embodiment, the positioning device 180 is at least partly arranged within the vacuum chamber 160.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances.

In some embodiments, the positioning device 180 further comprises an object table for holding the object during the inspection process performed by the EBI system 100. In such embodiment, the object 190 may be clamped onto the object table by means of a clamp such as an electrostatic clamp or vacuum clamp. Such a clamp may be integrated in the object table.

In accordance with the present disclosure, the positioning device 180 comprises a first positioner for positioning the object table and a second positioner for positioning the first positioner and the object table.

In some embodiments, the vacuum chamber 160 comprises an electromagnetic shield 1001 to shield of external electromagnetic influences. Such an electromagnetic shield 1001 may also be referred to as an EMI (electromagnetic interference) shield.

In some embodiments, the electromagnetic shield 1001 may be configured to shield a detector of the inspection tool 100 from external influences.

Figure 2A:
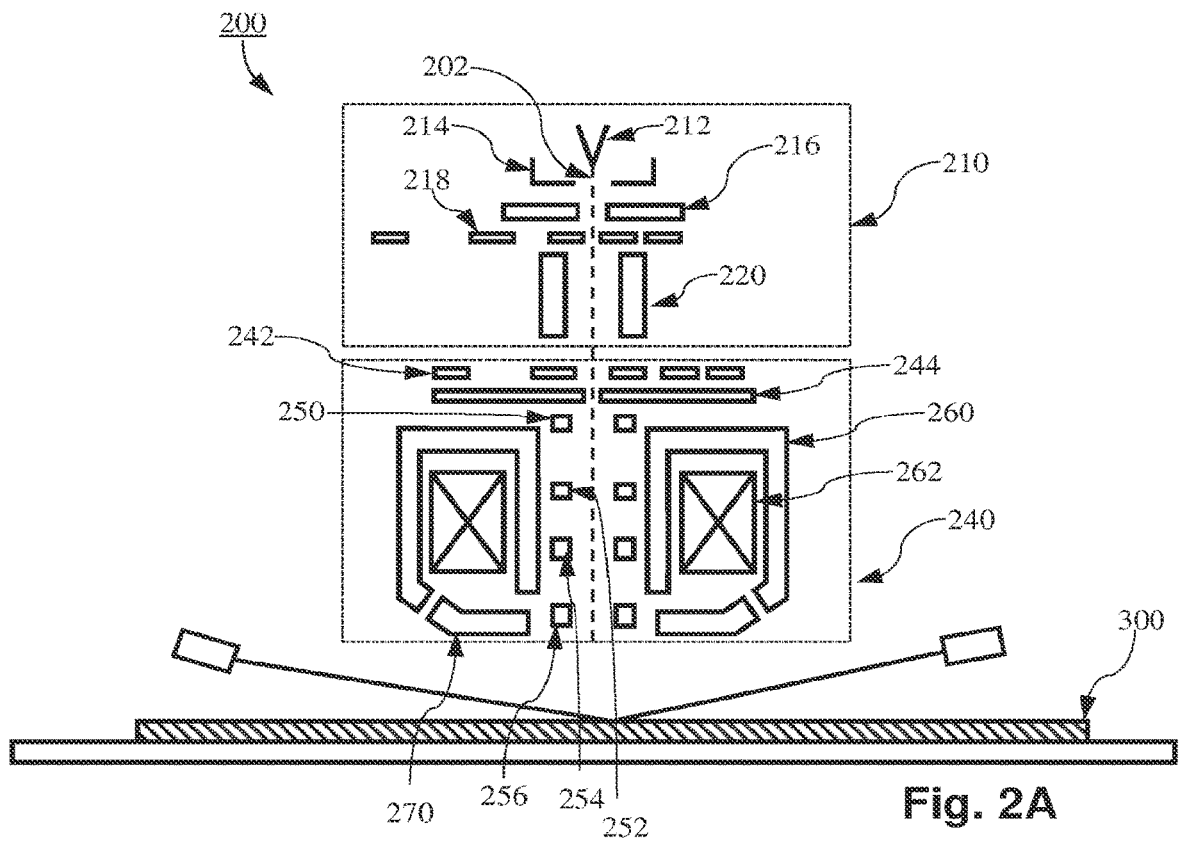
FIGS. 2A and 2B are schematic illustrations of an electron optical system as can be applied in some embodiments of the present disclosure.

FIG. 2A schematically depicts an embodiment of an electron optics system 200 as can be applied in e-beam inspection tool or system according to the present disclosure. The electron optics system 200 comprises an e-beam source, referred to as the electron gun 210 and an imaging system 240.

In some embodiments, the electron gun 210 comprises an electron source 212, suppressor 214, an anode 216, a set of apertures 218, and a condenser lens 220. The electron source 212 may be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bent to form a tip for placing the tungsten pin. Next, a $ZrO_2$ is coated on the surface of the tungsten pin, and is heated to approximately 1300° C. so as to be melted and cover the tungsten pin but uncover the pinpoint of the tungsten pin. The melted $ZrO_2$ can make the work function of the tungsten lowered and decrease the energy barrier of the emitted electron, and thus the electron beam 202 is emitted efficiently. Then, by applying negative electricity to the suppressor 214, the electron beam 202 may be suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. To condense the electron beam 202, the condenser lens 220 may be applied to the electron beam 202, which may also provide magnification. The condenser lens 220 shown in the FIG. 2 may, for example, be an electrostatic lens which can condense the electron beam 202. On the other hand, the condenser lens 220 can be also a magnetic lens.

Figure 2B:
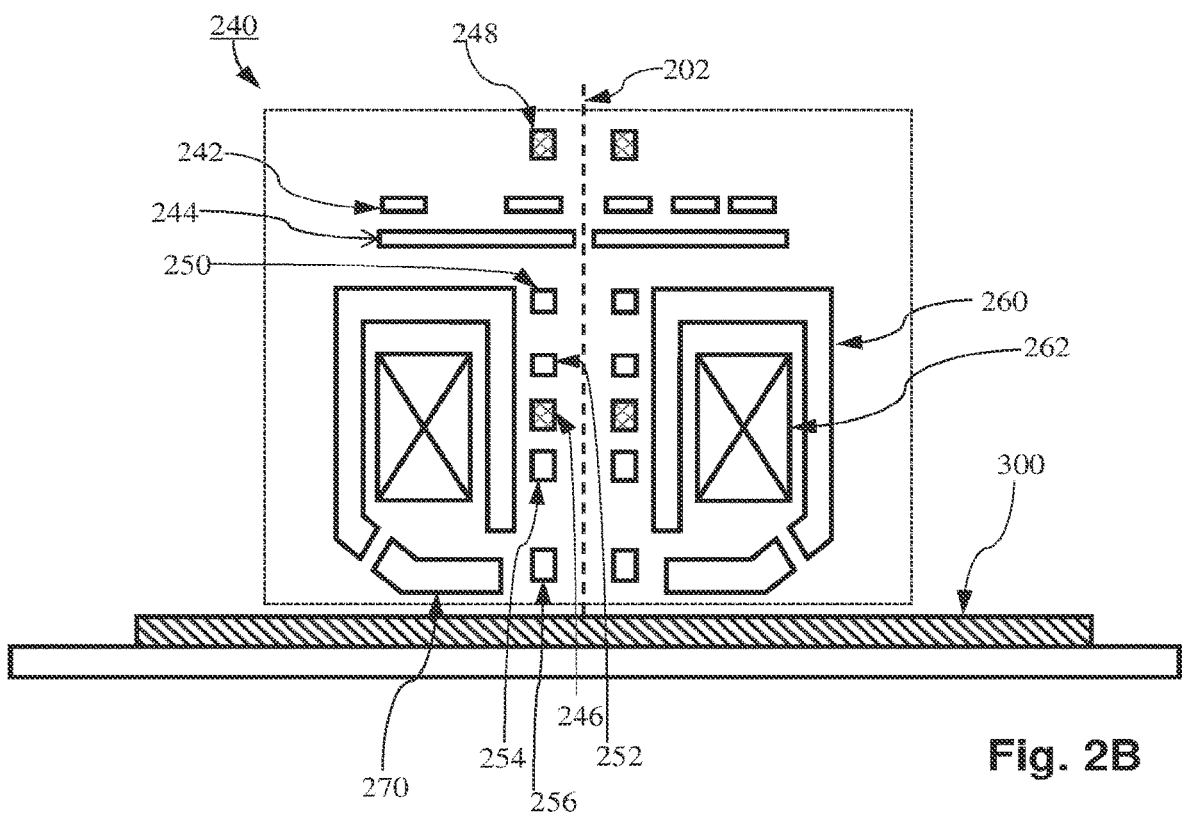

The imaging system 240 as shown in FIG. 2B comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 3:
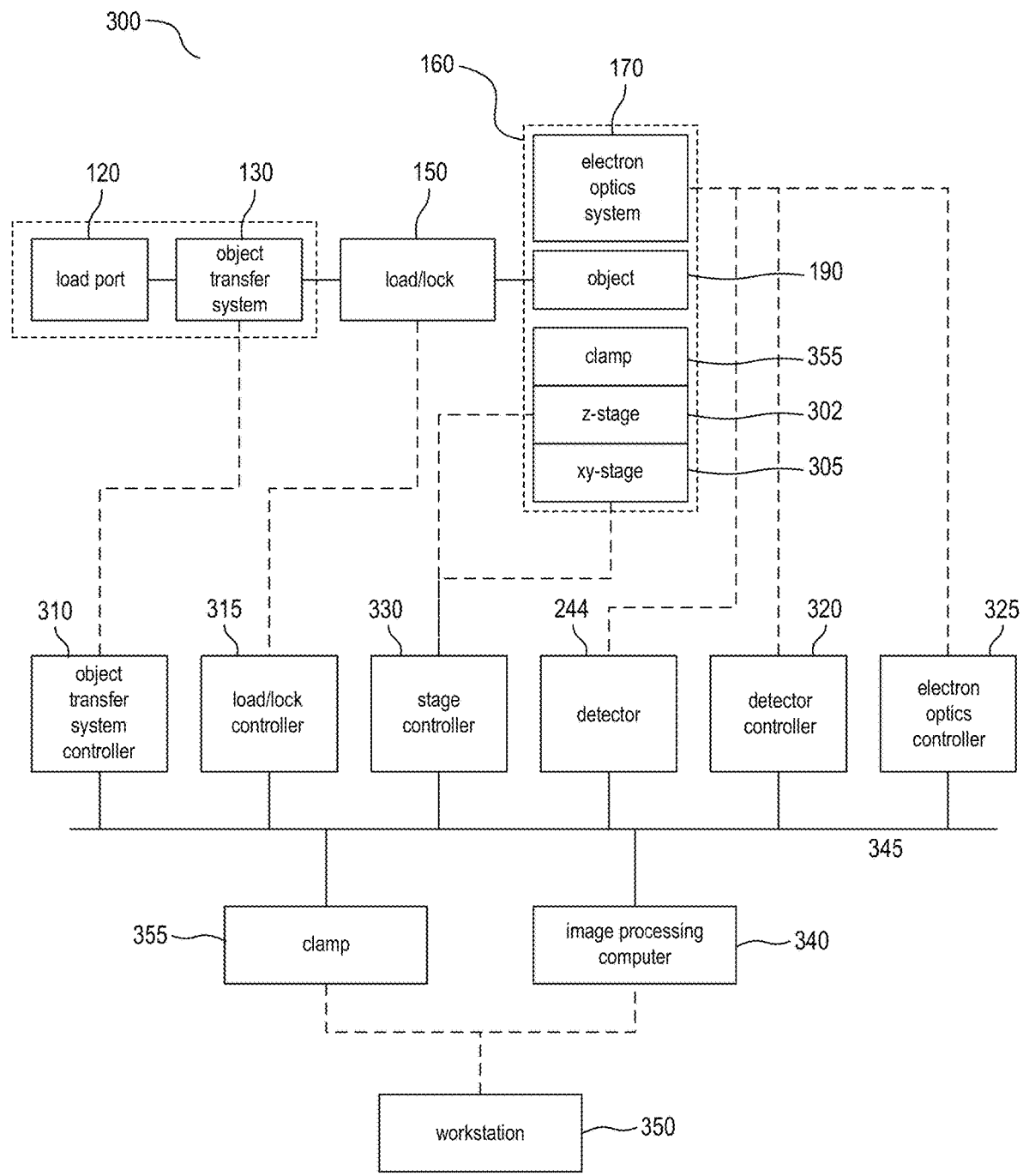
FIG. 3 schematically depicts a possible control architecture of an electron beam inspection (EBI) system, according to some embodiments of the present disclosure.

FIG. 3 schematically depicts a possible control architecture of an EBI system 300, according to some embodiments of the present disclosure. As indicated in FIG. 1, the EBI system comprises a load port 120, an object transfer system 130, a load/lock 150, an electron optics system 170 and a positioning device 180, e.g. including a z-stage 302 and an xy stage 305. As illustrated, these various components of the EBI system may be equipped with respective controllers, for example, an object transfer system controller 310 connected to the object transfer system 130, a load/lock controller 315, a stage controller 320, a detector controller 320 (for control of detector 244) and an electron optics controller 325. These controllers may be communicatively connected to a system controller computer 335 and an image processing computer 340 via a communication bus 345. In the embodiment as shown, the system controller computer 335 and the image processing computer 340 may be connected to a workstation 350.

In some embodiments, the load port 120 loads an object 190 (for example, a wafer) to the object transfer system 130, and the object transfer system controller 310 controls the object transfer system 130 to transfer the object 190 to the load/lock 150. The load/lock controller 315 controls the load/lock 150 to the chamber 160, such that object 190 that is to be examined can be fixed on a clamp 355, e.g. an electrostatic clamp, also referred to as an e-chuck. The positioning device, such as the z-stage 302 and the xy-stage 305, enable the object 190 to move under control of the stage controller 330. In some embodiments, a height of the z-stage 302 may be adjusted using a piezo component such as a piezo actuator. The electron optic controller 325 may control all the conditions of the electron optics system 170, and the detector controller 320 may receive and convert the electric signals from the electro optic system (for example, detector 244) into image signals. The system controller computer 335 may be operable to send the commands to the corresponding controller. After receiving the image signals, the image processing computer 340 may process the image signals to identify defects.

In some embodiments, in lithographic devices and metrology devices, such as those previously described, an object (such as a substrate or wafer on which the structures have been exposed using the patterned beam, or a reticle (or mask) for patterning a beam in a lithographic apparatus) is positioned accurately using a stage apparatus. Such a stage apparatus may be a reticle stage apparatus or a wafer stage apparatus and may comprise at least one positioning device and a substrate support, which is supported and moved by such a positioning device. The positioning device may be configured, for example, to control the position of the object support with a positioning error less than 0.1 nm, 1 nm, 10 nm, 100 nm, or 1000 nm.

Figure 4:
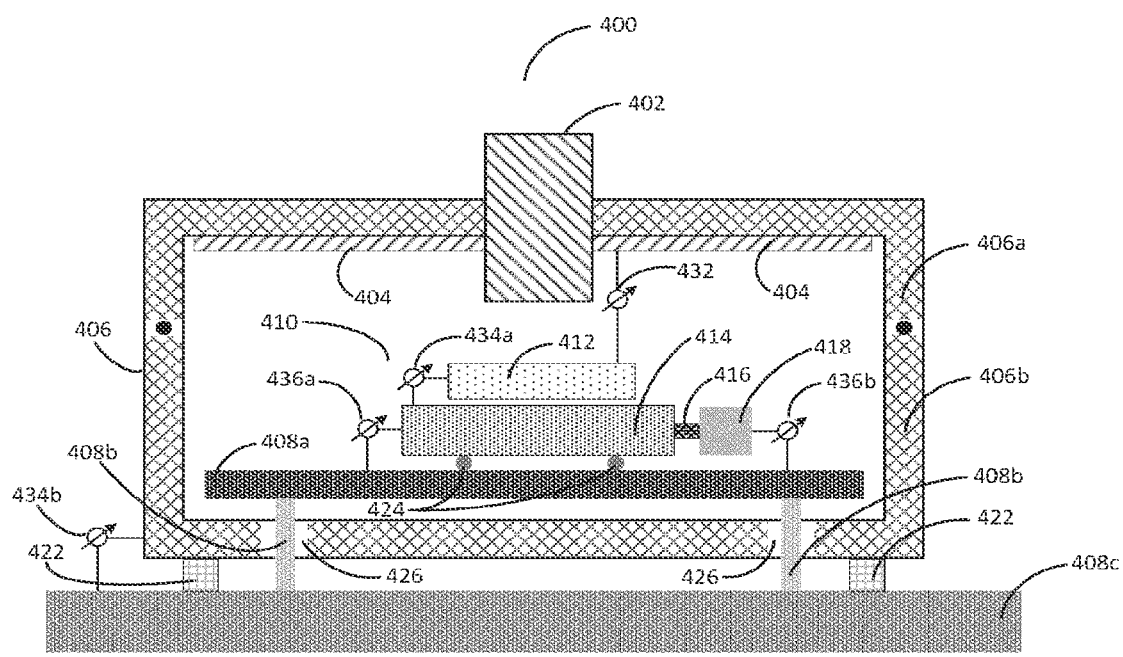
FIG. 4 depicts schematically a stage apparatus comprised in a vacuum chamber of an EBI system, or more specifically a multi-beam inspection (MBI) system, according to some embodiments of the present disclosure.

FIG. 4 schematically depicts a typical stage apparatus 410 locatable in a vacuum chamber 406 of an EBI system 400, which may be a multi-beam inspection (MBI) system using multiple e-beams in parallel, according to some embodiments of the present disclosure. In comparison to a conventional EBI system with only one e-beam, a MBI system is configured to scan a sample with multiple e-beams and thereby significantly improves system throughput. The vacuum chamber 406 may consist of a top vacuum chamber 406a, a bottom vacuum chamber 406b, and pressure/vacuum sealing components (not shown) for the connection points 426. The vacuum chamber 406 is silently suspended by multiple air-mounts 422 which are fixed on a baseframe 408c. Such air-mounts 422 act as an anti-vibration buffer such that the impact of external vibrations to the components comprised in the vacuum chamber 406 is reduced. The vacuum chamber 406 holds a metro frame (MF) 404, to which the electron optics system (EOS) 402 is attached.

In some embodiments, a stage apparatus 410, located at the lower part of the vacuum chamber 406, comprises a short stroke stage 412 to position the object support (not shown) and also comprises a long stroke stage 414 to position the short stroke stage 412 and the object support, where the connection arrangement may at least partially connect the object support to the short stroke stage 412. One or more stages, for example, the short stroke stage 412, the long stroke stage 414 or the object support, may have its own positioning device (not shown) for positioning and displacing. For example, the short stroke stage 412 provides a relative short travel range but precise positioning, whereas the long stroke stage 414 may provide a relative long travel range but with less precise (or coarse) positioning.

In some embodiments, the short stroke stage 412 provides precise positioning for the substrate support up to six degrees of freedom, i.e. three orthogonal linear axes and three orthogonal rotation axes, which is enabled by a first positioning device comprising multiple positioners or actuators, for example, Lorentz-force driven electromagnetic actuators. Such actuators form an electromechanical connection between the short stroke stage 412 and the long stroke stage 414. The travel range of the short stroke range 412 is relatively short, for example, tens of micrometres. The short stroke stage 412 is sometimes referred to as a block or mirror block as it may comprise one or more mirrors on its surface to enable interferometric position sensor (IFS) 432.

In some embodiments, the long stroke stage 414 which holds the short stroke stage 412 and the object support, provides coarse positioning in a much longer travel range, for example hundreds of millimetres. The motion of the long stroke stage 414 is enabled by a second positioning device. Each positioner or actuator 416, for example, an electromagnetic actuator, of the second positioning device is attached to one side of the long stroke stage. One or more balance masses 418 may then be attached to such actuators 416 so as to absorb and/or damp reaction forces generated from actuating the long stroke stage 414.

In some embodiments, the long stroke stage 414 is mounted on the baseplate 408a via roller bearings 424. The baseplate 408a is connected to the baseframe 408c via, for example, two mechanical feedthroughs 408b, which pass through two connection points 426 of the vacuum chamber. Such connection points 426 are subsequently sealed in a vacuum tight manner, for example, with a bellow. As the baseframe 408c is fixed either to the system's pedestal or directly to the floor (not shown), such mechanical feedthroughs 408b provide an effective force path to the outside world such that the reaction forces generated from the long stoke stage 414 can be further damped, therefore minimising the impact of the vibration disturbance to SEM measurements.

In some embodiments, the movement of the long stroke stage 414 in both x and y directions with respect to the baseplate 408a is guided by roller bearings 424. The position of the short stroke stage 412 with reference to the EOS 402 is measured by the IFS 432. Whereas, the position of the long stroke stage 414 with reference to the baseplate 408a is measured by an encoder 436a, or more specifically a digital encoder. The relative position change between the long stroke stage 414 and the short stroke stage 412 is monitored using a (first) differential position sensor (DPS) 434a. The stage apparatus 410 can be configured to operate in either a high accuracy mode or a low accuracy mode. In the high accuracy mode, the scan range of the stage apparatus 410 is restricted by the measurement range of the IFS 432 which is typically greater than the diameter of the object held by the object support, e.g. a 300 mm wafer. Whereas, in the low accuracy mode, the scan range of the stage apparatus 410 is much larger as it is determined by the travel range of the long stroke stage 414.

In some embodiments, the two baseline control modes—the high accuracy mode and the low accuracy mode, can be switched between each other on a system level (by the system controller) before the start of any measurements. For example, when loading the wafer onto the substrate support, the low accuracy mode is preferred as it provides longer travel range. Once the wafer is positioned within the measurement range of the IFS 432, the low accuracy mode can be switched to the high accuracy mode for SEM measurements. After being switched into the high accuracy mode, the stage apparatus 410 may need to be zeroed so as to re-center both stages. However, in some embodiments of the present disclosure, the low accuracy mode is still preferred even when the wafer is positioned within the measurement range of the IFS 432. Such two baseline control modes are based on a master/slave configuration.

When operating in the high accuracy mode, the short stroke stage controller (master) relies on the data measured by the IFS 432 to control the position of the short stroke stage 412, and the long stroke stage controller (slave) relies on data measured by the DPS 434a to control the position of the long stroke stage 414. In the meantime, the encoder 436a located between the long stroke stage 414 and the baseplate 408a operates passively (i.e., performing position measurement without the measurement result being used in controlling the stage) such that the long stroke stage 414 follows the movement of the short stroke stage 412 without being affected by the baseplate 408a. The use of the laser-based IFS 432 allows nanometre-scale positioning accuracy to be achieved for the short stroke stage 412. When operating in the low accuracy mode, the short stroke stage controller (slave) uses the data measured by the DPS 434a to control the position of the short stroke stage 412. And the long stroke stage controller (master) uses data measured by the encoder 436a to control the position of the long stroke stage 414. Since the IFS 432 only acts passively, performing position measurement without the measurement result being used in controlling the stage, the short stroke stage 412 thereby follows the movement of the long stroke stage 414. It is noted that the IFS 432 stops performing position measurements if the stage apparatus is outside the measurement range of the IFS 432.

Once a position measurement is complete, each enabled metrology sensor, i.e. IFS, DPS or encoder, sends the measured data in the form of an electrical signal to the respective stage controller. The receiving stage controller evaluates the signal in accordance to certain predefined requirement and sends back a control signal to the corresponding stage to either change the position or stay in the same position. This is referred to as closed-loop control, or feedback control. Either or both of the long stroke stage and short stroke stage can be operated in a closed-loop mode.

As an example, when the short stroke stage 412 is being operated in a closed-loop control mode, the short stroke stage controller compares the measured position value received either from the IFS 432 in the high accuracy mode or from the DPS 434a in the low accuracy mode with a predefined position set-point to obtain a position error signal. Such an error signal is then fed to an algorithm, for example, a proportional-integral-derivative (PID) algorithm, to compute an output signal in order to reduce the error. Based on the computed output signal, the short stroke stage controller will determine an appropriate compensatory movement and then command the short stroke stage 412 to adjust its position accordingly. The IFS 432 or the DPS 434a continues to measure the stage position and send the measured new position value to the controller so as to continuously and/or periodically update the error signal and dynamically position the short stroke stage with respect to the position set-point. In such a manner, the short stroke stage 412 is continuously and/or periodically being measured, evaluated and adjusted such that the stage is precisely positioned, and the stage position is actively maintained.

While the short stroke stage is operable (at least) in a closed-loop mode, the long stroke stage can be operated in a closed-loop mode or an open-loop mode. The control mode of the long stroke stage can be switched between the closed-loop control mode and the open-loop control mode as required.

It should be noted that after each switching action, the stage, either the short stroke stage 412 or the long stroke stage 414, may take a certain amount of time to settle completely. However, if the stage was already at standstill, it would remain stationary without settling after a switching action.

In some embodiments, the existence of various external disturbances can cause the vacuum chamber 406 to make low frequency movements on the air-mounts, which can be monitored and measured by a second DPS 434b. The frequency of such movements may be 1-10 Hz, 3-10 Hz, 5-10 Hz, or 10 Hz, and the amplitude may be 5-20 µm, 10-20 µm, 15-20 µm, or 20 µm. In case where the stage apparatus 410 operates in the high accuracy mode and in the closed-loop control mode, the position of the short stroke stage 412 is closed-loop controlled by the IFS 432 with reference to the EOS 402 which is connected to and/or fixed to the MF 404. As a result, positioning of the short stroke stage is controlled relative to the MF 404 via the IFS 432. Since the MF 404 is passively held by the vacuum chamber 406, any movements of the vacuum chamber 406 will result in movements of the short stroke stage 412. These movements of the short stroke stage 412 are, in turn, passed on to the long stroke stage 414 as the long stroke stage 414 is controlled relative to the short stroke stage 412 via the DPS 434a. In such a manner, the long stroke stage 414 is coupled to the vacuum chamber 406 and therefore makes continuous micro-movements with reference to the baseplate 408a corresponding to the movements of the vacuum chamber 406.

Additionally, or alternatively, such continuous micro-movement of the long stroke stage could also result from the movement of the EOS 402 itself. Since the stage apparatus 410 could be used in a different processing unit other than the EOS 402, the measurement reference used for the closed-loop operation of the short stroke stage will thus be application dependent. For example, the measurement reference could be a projection optics when the stage apparatus 410 is used in an exposure apparatus. Or the measurement reference could be measurement/inspection probe when the stage apparatus 410 is used in a measurement/inspection apparatus.

In some embodiments, during such continuous micro-movements, the carriages and rails of the roller bearings 424, providing an interface between the long stroke stage 414 and the baseplate 408a, are continuously moving with respect to each other. This causes the lubricant, for example a grease, being squeezed out of the gap between the rolling elements and guiding elements. Lack of lubrication leads to direct metal-to-metal contact in the roller bearings 424 resulting in fine particle fragments being abraded from the contacting surfaces. These fine particles continue to oxidise into hard and abrasive particles which wear and damage the contacting metal surfaces. Such a failing mechanism is also called fretting corrosion. When the fretting corrosion process starts, the roller bearings will degrade very quickly and can break in a short duration of time, for example, from several hours to several days. The degradation of the roller bearings further increases the friction between contacting metal surfaces and hence has a detrimental impact to the subsequent SEM measurements. For example, the roller bearings 424 with excessive friction can significantly reduce the movement smoothness of the long stroke stage 414 and in turn reduce the precision of positioning the substrate relative to the electron beam. Moreover, the failure of the roller bearings 424 requires replacement and thus significantly reduces the system's availability.

To alleviate the fretting corrosion issue, other alternative mounting technologies, such as air bearings and magnetic bearings, could be considered. However, air bearings 426 could potentially have air leakage which would increase the pressure inside the vacuum chamber 406 and degrade the vacuum quality, which would have a detrimental impact on SEM measurements. Whereas the magnetic field of magnetic bearings could influence the projection of the electron beam, which may degrade the quality of the subsequent SEM images. To have a negligible impact on the propagation of the electron beam, the strength of the magnetic field from magnetic bearings would need to be in the order of milligauss (mG). Such a specification may be unreasonable for magnetic bearings.

Occasionally, a maintenance process, such as greasing strokes may be performed to redistribute the grease in the roller bearings 424. This is typically implemented by moving the long stroke stage 414 in both x and y directions over the entire travel range. Significantly increasing the frequency of such a maintenance routine could alleviate the fretting corrosion issue. However, doing so may negatively impact the system's throughput.

It could also be possible to mount the roller bearings of the long stroke stage 414 directly onto the bottom vacuum chamber 406b instead of on the baseplate 408a, i.e. as a mechanical connection between the bottom vacuum chamber 406b and the long stroke stage 414. Since there is no relative movement between the long stroke stage 414 and the vacuum chamber 406, the fretting corrosion is thus avoided. However, in such a manner, dynamic forces generated from movement of the long stroke stage would be transmitted to the vacuum chamber 406, via the friction between carriages and rails of the roller bearings, which then leads to excitation of the EOS 402 and thus image distortion. Depending on how the actuators 416 and balance masses 418 are mounted, excitation of these components could also be induced by such dynamic forces. Furthermore, vibrations of the long stroke stage 414 would be transmitted to the vacuum chamber 406 via the roller bearings and thus further degrade image quality. This disclosure discloses several efficient and practical methods for minimizing the risk of fretting corrosion of the roller bearings 424.

To address the fretting issue disclosed herein, it is proposed to add an anti-fretting function block to the system controller such that the long stroke stage 414 can be selectively decoupled from a reference associated with the vacuum chamber, metrology frame and/or EOS, so as to decouple the long stroke stage 414 from the vacuum chamber movements. By decoupling the long stroke stage 414 from the vacuum chamber movements, the micro-movements against the baseplate 408a can be avoided and thus the fretting corrosion can be reduced. This decoupling could be selective, and only used in one or more particular modes of operation, for example when the stages are at relative stand-still, and there is no imminent move. Other embodiments may comprise operating the long stroke stage such that it is always decoupled from the vacuum chamber movements.

Figure 5:
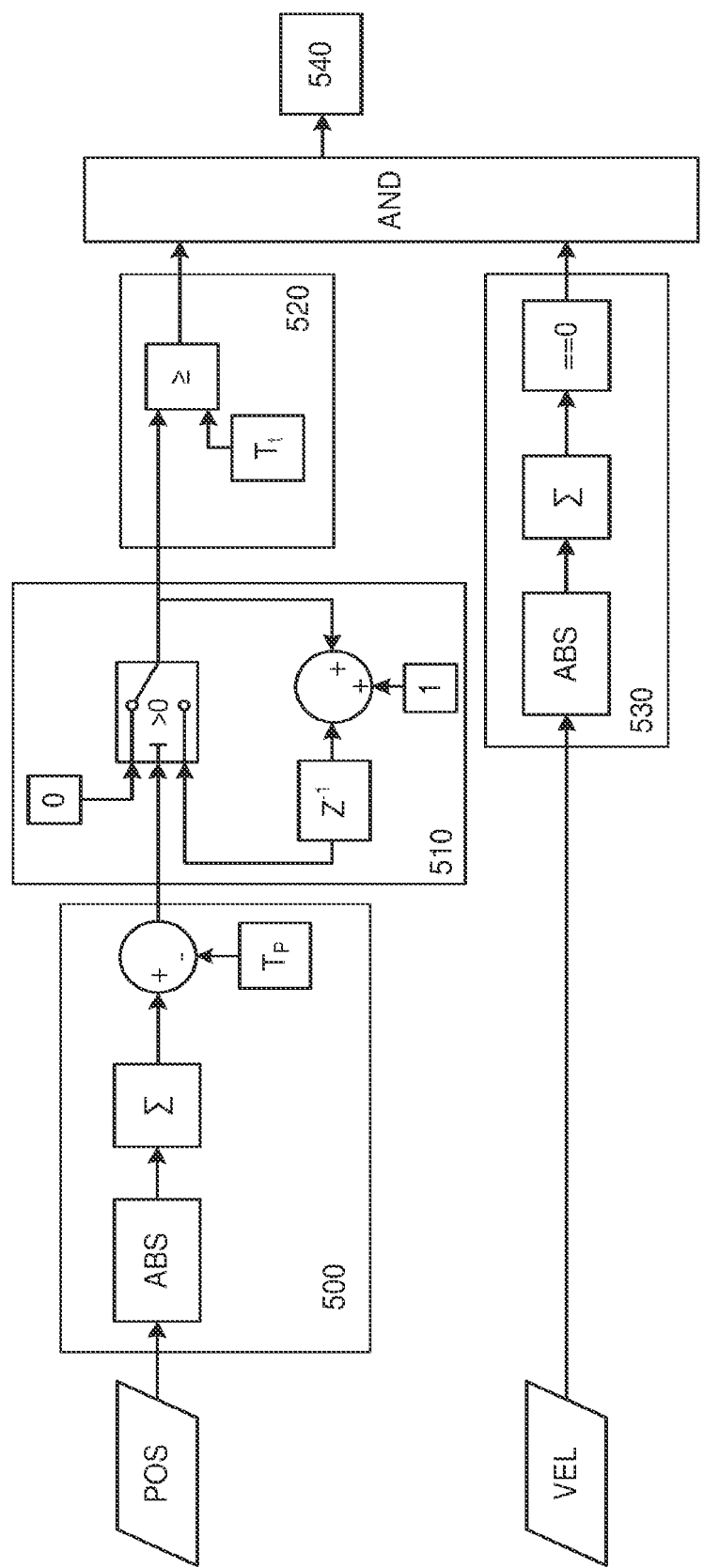
FIG. 5 is a block diagram of an exemplary anti-fretting function block according to some embodiments of the present disclosure.

FIG. 5 is a block diagram illustrating an anti-fretting function block, according to some embodiments of the present disclosure. It comprises a movement check module 500 which receives position data POS, a timer module 510, a counter module 520, an imminent move check module 530 (optional) which receives set-point velocity data VEL (e.g., set to 0 if there is no imminent movement or 1 if there is an imminent movement) and an anti-fretting control module 540. The detail within each of these blocks is a purely exemplary possible implementation of each of the modules. For example, the movement check module 500 may take the sum of the absolute values of the position data POS from the DPS sensor and compare this to a position or offset threshold $T_P$. The timer module and counter module 520 enforce a settling delay before any change of operational mode. The imminent move check module 530 checks whether the long stroke stage the set-point velocities are zero (i.e. there is no imminent movement). The anti-fretting control module 540 puts the system into an anti-fretting control mode.

Figure 6:
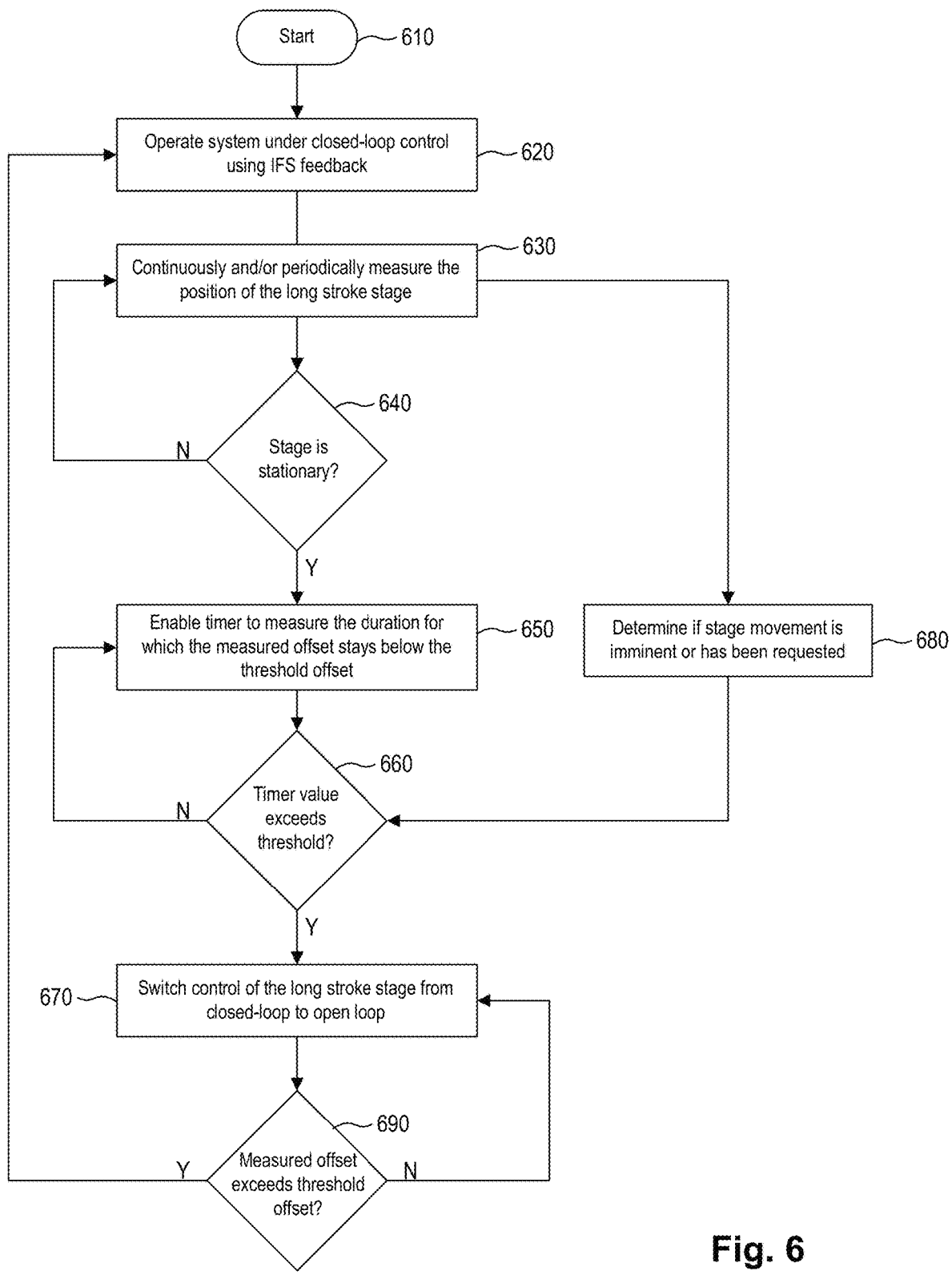
FIG. 6 is a flow chart diagram of a first anti-fretting control mode according to some embodiments of the present disclosure.

FIG. 6 is a flowchart illustrating a control procedure, according to some embodiments of the present disclosure. The method starts at 610, e.g., before commencement of a measurement.

At step 620, the system is operated under closed-loop control using the IFS feedback. This step assumes that the short stroke stage 412 has been moved to, or is already in, a position within the measurement range of the IFS 432. The long stroke stage 414 is also closed-loop controlled using the feedback of the DPS 434a. The encoder 436a between the long stroke stage 414 and the top base plate 408a is set to only passively monitor position and is not used in control of the long stroke stage 414. In such a manner, the stage apparatus is operated in a Master/Slave configuration with the short stroke stage controller being Master and the long stroke stage controller being Slave.

At step 630, the DPS 434a continuously and/or periodically measures the position (e.g., in x and y, parallel with the object plane) of the long stroke stage 414. In parallel, the stage set-points (e.g., in both x and y directions) are evaluated at step 680 to determine if a stage movement is imminent or has been requested.

At step 640, upon receiving the data from the DPS sensor, the anti-fretting function block compares the measured position or offset, (e.g., the sum of the absolute values of the measured x and y position of the short stroke stage with respect to the long stroke stage), with a predetermined threshold offset value $T_P$. When the measured offset is below the threshold offset, the stage may be stationary or substantially stationary.

At step 650, a timer may be enabled to measure the duration for which this measured offset stays below the threshold offset so as to allow for a settling period. Since it takes some time for the long stroke stage 414 to settle after switching to the closed-loop control mode, it should be ensured that the predetermined timer threshold is greater than the settling time of the stage. The timer threshold $T_t$ may be 10 seconds or more, 15 seconds or more, 20 seconds or more, or 30 seconds or more. In such a manner, a large number of micro-movements of the long stroke stage 414 may be prevented.

At step 660, it is determined whether the timer value exceeds a predetermined time threshold value, and additionally whether no stage movement is imminent or has been requested (for example, whether the sum of the absolute values of x and y set-point velocities is 0 m/s). If this step determines that the stage has been sufficiently stationary for a threshold duration and that no move is imminent, control of the long stroke stage 414 (e.g., via the DPS 434a) is switched from the closed-loop control mode to the open-loop control mode at step 670. When control of the long stroke stage 414 is set to the open-loop control mode in this manner, it no longer follows the short stroke stage 412 and hence its control is decoupled from any movement of the vacuum chamber 406. The short stroke stage 412 remains closed-loop controlled by the IFS 432 and the DPS 434a continues to monitor position of the long stroke stage 414.

At step 690, should the measured offset by the DPS 434a exceed the threshold offset or the stage be instructed to move to a new position, control of the long stroke stage 414 the method returns to the step 630 and the system is switched back to the closed-loop control mode.

Figure 7:
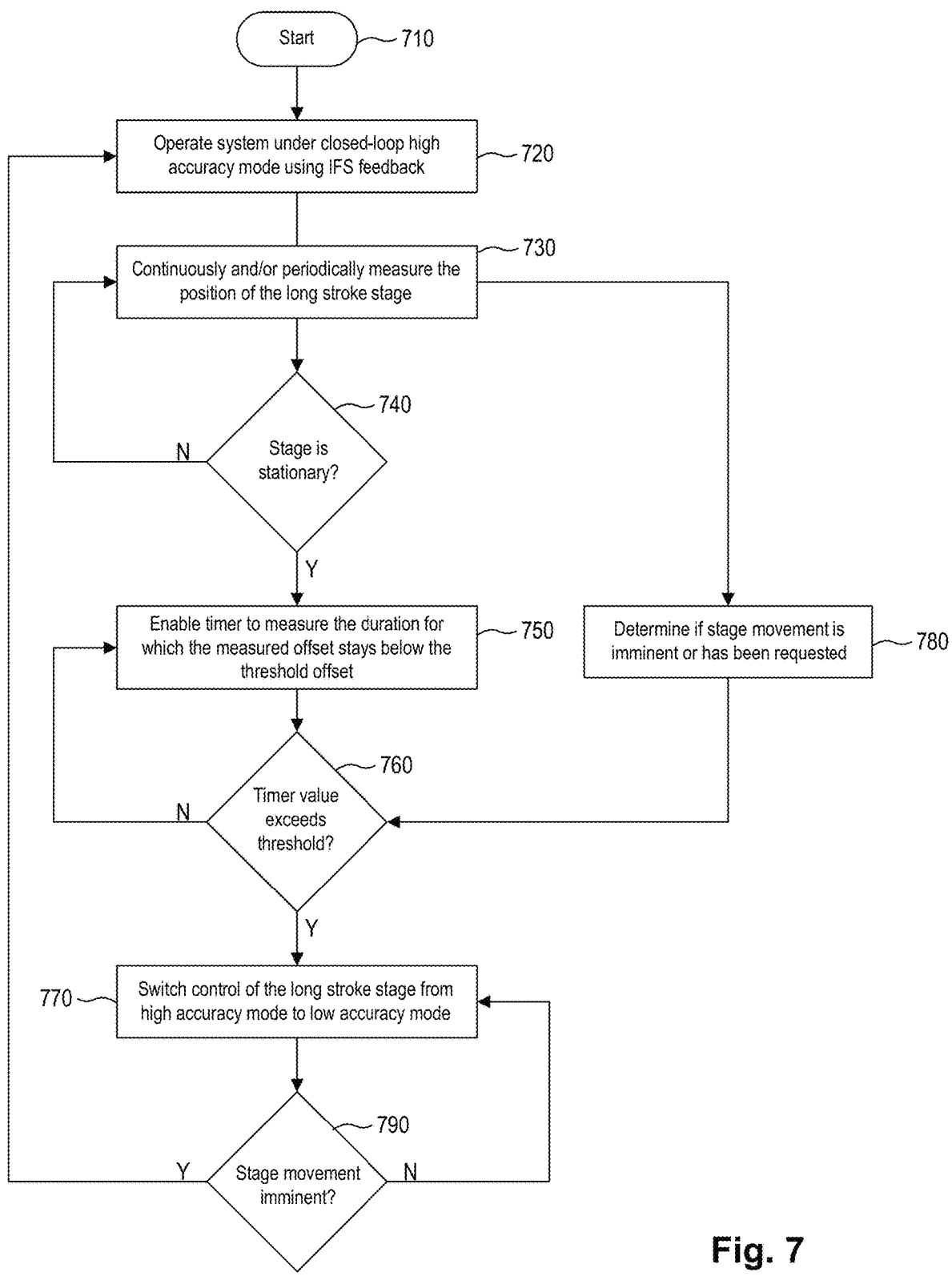
FIG. 7 is a flow chart diagram of a second anti-fretting control mode according to some embodiments of the present disclosure.

FIG. 7 is a flowchart illustrating a second embodiment of the present disclosure, where the anti-fretting function block enables a second anti-fretting control mode. This has a similar control procedure as that of the first anti-fretting control mode shown in FIG. 6.

Steps 720 and 730 may perform substantially similar functions as steps 620 and 630 of FIG. 6. For example, the initial control status of the short stroke stage 412 is in the closed-loop control mode using the feedback from the IFS 432 and the long stroke stage 414 is in the closed-loop control mode using the feedback from the DPS 434a or closed-loop high accuracy mode. When certain predetermined conditions evaluated at the step 740 and 760 are all fulfilled, for example when the measured offset of the long stroke stage 414 with respect to the short stroke stage (as measured by the DPS 434a) is below a certain threshold offset for at least a certain amount of time, the stage apparatus 410 is then switched from the closed-loop high accuracy mode to a closed-loop low accuracy mode at step 770, i.e. the long stroke stage is switched from being controlled by the DPS 434a to the encoder 436a and the short stroke stage 412 is switched from being controlled by the IFS 432 to the DPS 434a, corresponding to a different Master/Slave configuration with the long stroke stage controller being Master and the short stroke stage being Slave. The timer threshold may be 10 seconds or more, 15 seconds or more, 20 seconds or more, or 30 seconds or more. When operating in the closed-loop low accuracy mode, the short stroke stage 412 follows the long stroke stage 414 via the DPS 434a and the long stroke stage 414 is positioned using the baseplate encoder 436a. As a result, both stages are decoupled from the vacuum chamber and therefore fretting corrosion of the roller bearings 424 is prevented. The system goes back to step 720 if any condition evaluated at step 790 is fulfilled (for example, if a stage movement is imminent).

In comparison to the first embodiment shown in FIG. 6, the control procedure shown in FIG. 7 may be slower due to the fact that switching between the high and low accuracy modes at the step 770 takes a finite amount of time to complete. Also, it may be undesirable to operate the stage apparatus 410 in the low accuracy mode for SEM measurements as the image quality may be negatively affected. In case where the stage apparatus 410 is switched back to the high accuracy mode at step 720, the short stroke stage potentially needs to be zeroed again before it can be controlled in the high accuracy mode via the IFS 432. This may be the case, for example, if, after the mode switch, the short stroke stage 412 is outside the measurement range of the IFS 432 and hence it needs to be re-zeroed before being re-centred again. Such a re-zeroing process could be avoided if the option of an alternative control mode, such as an idling mode, is added to the controller. The idling mode may be such that, instead of being switched from the high accuracy mode to the low accuracy mode, the stages are switched to the idling control mode in which the short stroke stage 412 remains closed-loop controlled via the IFS 432 while the long stroke stage 414 is closed-loop locked to the same position via the encoder 436a. The switch between the high accuracy mode and the idling control mode can be implemented on system level by the system controller.

Figure 8:
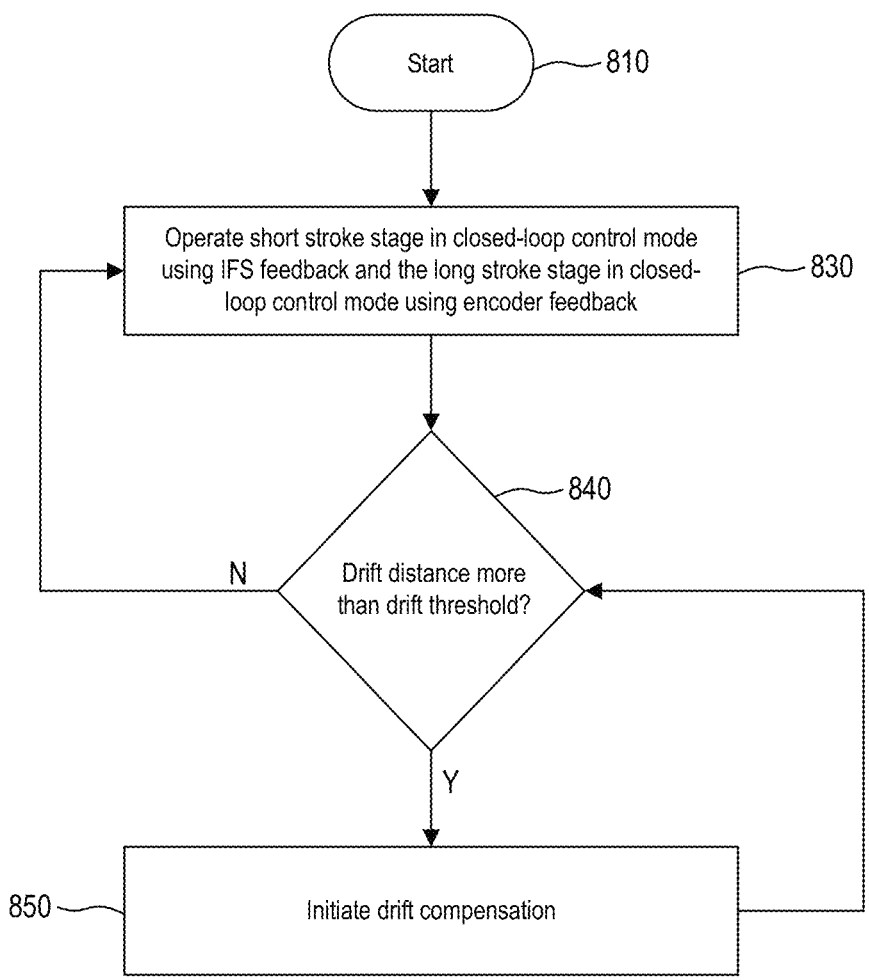
FIG. 8 is a flow chart diagram of a third anti-fretting control mode according to some embodiments of the present disclosure.

According to the some embodiments of the present disclosure, the anti-fretting function block enables a third anti-fretting control mode. FIG. 8 illustrates the control procedure of the third control mode. The method starts at step 810. At step 830, the short stroke stage 412 is operated in the closed-loop control mode using the IFS feedback and the long stroke stage 414 is in the closed-loop control mode using the encoder feedback. In such a manner, the stage apparatus 410 is operated in a Master/Master configuration. The long stroke stage 414 is not controlled by the short stroke stage 412 and thus decoupled from the vacuum chamber 406. In comparison to the control procedure shown in FIG. 6, the control procedure shown in FIG. 8 does not require any change in control mode for the long stroke stage 414, i.e. switched from the open-loop control mode to the closed-loop control mode, therefore preventing the potential stage settling effect. However, in another embodiment, the Master/Master control mode described here may be entered via a change in control mode, e.g., a switch from closed-loop control using the IFS feedback to the Master/Master control mode.

It can be appreciated that operating in a Master/Master configuration may result in drift between the long stroke stage 414 and the short stroke stage 412. The amount of drift is limited by the relative travel range between the long stroke stage 414 and the short stroke stage 412 and is monitored by the DPS 434a. The relative travel range between the long stroke stage 414 and the short stroke stage 412 may be 100 μm, 200 μm, 300 μm or 400 μm, for example. To address this, a drift compensation scheme may be added to cover at least such a relative travel range. For example, at step 830, drifting distances (offsets) in both x and y directions are measured by the DPS 434a. Such drifting distances are then evaluated at step 840. If the drifting distances are greater than a predetermined drift threshold value, the system will start the drift compensation procedure at the step 850. By regularly updating and correcting the offset between the long stroke stage 414 and the short stroke stage 412, the substrate support held by the short stroke stage can be maintained in the centre of the travel range of the short stroke stage 412. When the drift compensation procedure is completed, the new drifting distances are measured at step 850 and evaluated at step 840. If the new drifting distances are smaller than a predetermined threshold value, the system returns to step 830 for a further measurement. Otherwise, the system goes to step 850 and performs another drifting compensation procedure until the drift level is acceptable.

In some embodiments, a dead-zone function block (or controller) may be added to the system controller to prevent the long stroke stage 414 reacting to any small movements which could be induced by the vacuum chamber drifts/movements or sensor noise, e.g. a flipping of an encoder bit. The dead-zone controller may have, in some embodiments, a tolerance range which is predefined (or fixed) depending on the control mode of the long stroke stage. Some control modes (e.g. closed-loop controlled via the DPS 434a) may require a wider tolerance range than other control modes (e.g. closed-loop controlled via the encoder 436a). Alternatively, a smart dead-zone controller may be used such that the controller continuously evaluates the impact of external disturbances (e.g. vacuum chamber drifts/movements) and self-adjusts the tolerance range accordingly so as to accommodate acceptable amplitude changes of external disturbances. The evaluation may take account of available information of the EBI system 400, such as one or more of control modes, wafer inspection recipe, and one or more variables of the stage apparatus 410, such as sensor signals and set-points of the closed control loops. The dead-zone function block could be implemented either in combination with or as an alternative to the anti-fretting function block.

As such, according to some embodiments, a dead-zone function block could be implemented in combination with the anti-fretting function block used in any of the preceding embodiments. In an example of such an embodiment, the dead-zone controller is added to a system where the stage apparatus 410 is operated in a Master/Master configuration as described in the third embodiment. The closed-loop control of the long stroke stage 414 via the encoder 436a can result in limit cycling which is induced by encoder noise (e.g., manifesting itself as a flipping of an encoder bit). Such limit cycling causes small stage movements and hence increases the risk of fretting corrosion of the roller bearings 424. Therefore, to further reduce the risk of fretting corrosion, a dead-zone could be enabled at step 830 (referring to FIG. 8). The dead-zone controller defines a dead-zone or tolerance range of movement or the encoder noise which will be ignored by the long stroke stage. In this way, the long stroke stage controller will not react to such movement or the encoder noise (to the extent it is within the tolerance range), and thus fretting corrosion is reduced. For the Master/Master configuration described above, the risk of fretting corrosion is relatively low and therefore the tolerance range of the dead-zone controller may be predefined (or fixed) to a relatively narrow range, for example, 2 to 3 encoder counts or approximately 1 μm. By contrast, in some embodiments where a dead-zone controller is used in combination with the first embodiment described above (i.e., where the stage apparatus 410 is operated in the high accuracy Master/Slave configuration where the long stroke stage is closed-loop controlled via the DPS 434a), a relative large tolerance range may be defined (e.g. greater than the chamber vibrations/drift, for example at approximately 10 μm) as the risk of fretting corrosion is higher. Alternatively, a smart (dynamic) dead-zone controller with a dynamically set tolerance range may be implemented in any of these embodiments (the benefits of such a dynamic dead-zone may be greater where the risk of fretting corrosion is higher, e.g., when operating in the Master/Slave configuration). The dynamic tolerance range may be adjusted based on one or more of the control mode being operated in, the level (magnitude) of disturbance encountered, the measurement recipe or particular use-case and environmental factors (e.g., floor, surrounding machines etc.). The smart dead-zone controller will be described in more detail in the next embodiment. The implementation of the dead-zone function block could cause some transient behaviour of the long stroke stage 414.

Figure 9:
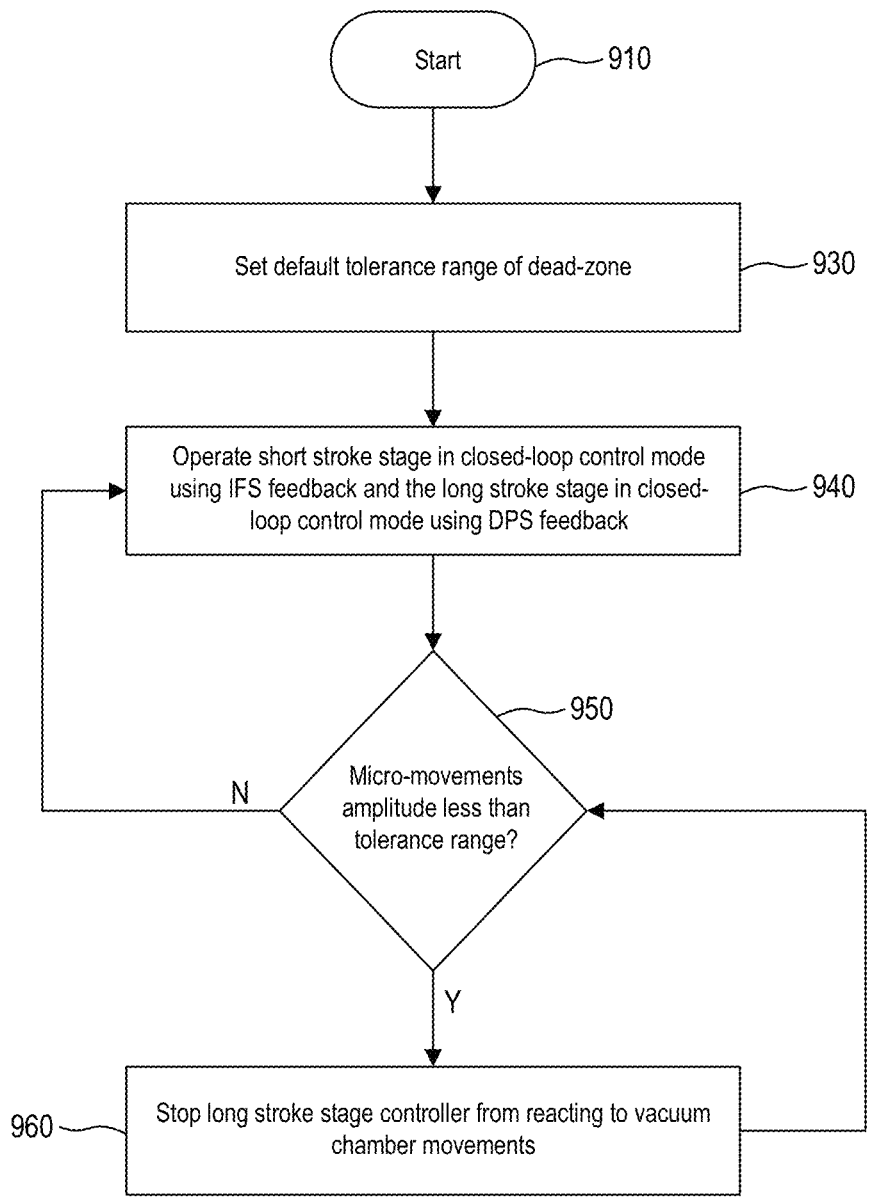
FIG. 9 is a flow chart diagram of a dead-zone function control mode according to some embodiments of the present disclosure.

In some embodiments, the dead-zone function block is implemented as an alternative to the anti-fretting function block; i.e., as an alternative method to decouple the long stroke stage 414 from the reference and therefore the vacuum chamber movement. FIG. 9 illustrates the control procedure of such a dead-zone control mode, according to an embodiment where the stage apparatus 410 is operated in the high accuracy Master/Slave configuration and a smart or dynamic dead-zone controller is used. The method starts at 910, and at step 930 a default tolerance range of the dead-zone is set. Once the dead-zone range (dead-zone threshold) is set, the system proceeds to the step 940 and is ready for SEM measurements. The short stroke stage 412 operates in the closed-loop control mode using the feedback from the IFS 432 and the long stroke stage 414 operates in the closed-loop control mode using the feedback from the DPS 434a. In such a manner, the long stroke stage 414 is coupled to the vacuum chamber 406, resulting in micro-movements of the stage. At step 950, the amplitude of the resultant micro-movements is evaluated with respect to the tolerance range of the dead-zone. If the amplitude of the resultant micro-movements is smaller than such tolerance range, the system proceeds to step 960 where the long stroke stage controller is made to stop reacting to the vacuum chamber movements. For example, control of the long stroke stage 414 may be set to an effective open loop operation when within the dead-zone and as such decoupled from the vacuum chamber 406. Alternatively, the long stroke stage controller may be configured not to respond to the measurement signal from the DPS 434a, for example, by ignoring the measurement signal or by regarding the measurement signal as being substantially zero, when within the dead-zone. However, at step 950, if the amplitude of the micro-movements is determined to be larger than the tolerance range of the dead-zone, the system returns to step 930 and increases the tolerance range according to an evaluation. While the long stroke stage 414 is operating in the dead-zone at step 960, the measured amplitude of the micro-movements is continuously evaluated. Should the measured amplitude increase and exceed the tolerance range, the system returns to step 930 and increases the tolerance range accordingly. It should be noted that, as with the previous example, this fifth embodiment may use a fixed dead-zone instead of a dynamic dead-zone. Also, as previously described, the dynamic tolerance range may be adjusted.

In some embodiments, the risk of fretting corrosion of the roller bearings 424 may be mitigated by implementing a smart greasing mechanism. The smart greasing mechanism evaluates the status of the stage apparatus 410 by taking account of different variables of the stage apparatus 410, such as the standstill time of the long stroke stage 414, the amplitudes of micro-movements of the long stroke stage and/or the roller bearings 424, and set-points of closed control loops, and then decides the best time to perform a maintenance process (for example, greasing strokes), to ensure that the roller bearings 424 are always well lubricated. This is in contrast to the present method of performing the process at regular intervals.

Figure 10:
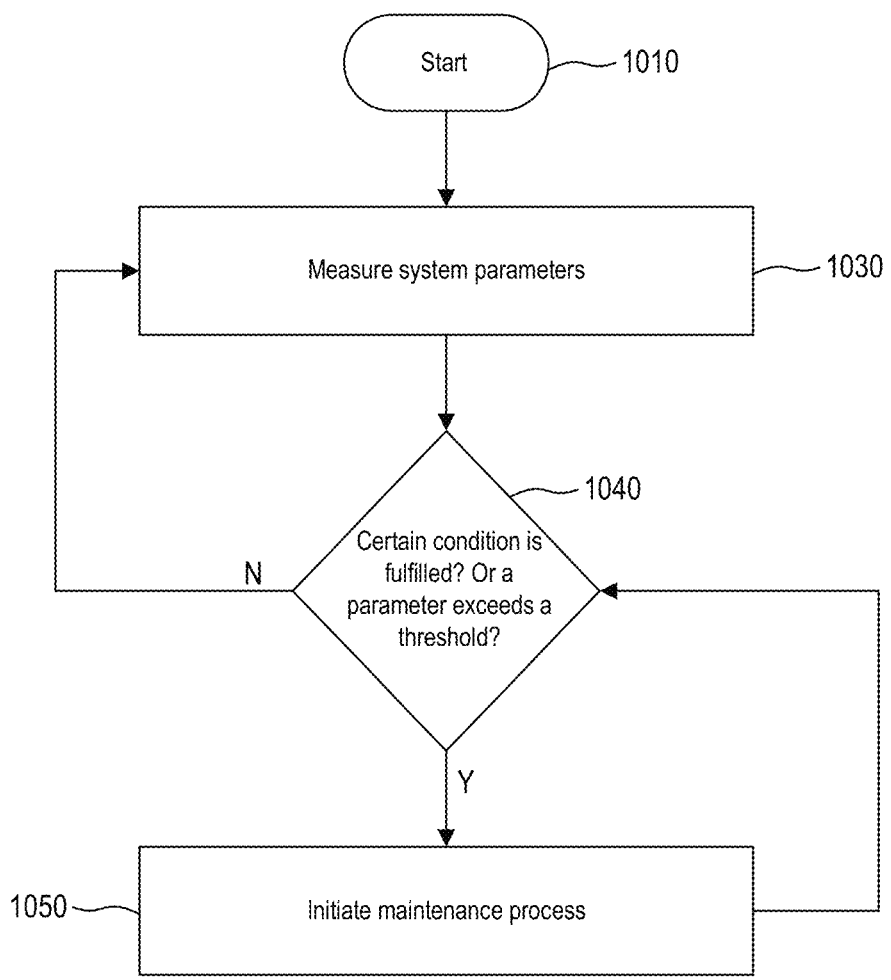
FIG. 10 is a flow chart diagram of the smart greasing mechanism according to some embodiments of the present disclosure.

In some embodiments, a smart greasing mechanism could replace the anti-fretting function block or the dead-zone function block and may be used as an alternative way of addressing the fretting corrosion problem. Alternatively, such a method may be used in combination with any of the other embodiments described herein. FIG. 10 illustrates the control procedure of such a smart greasing control mode. The method starts at step 1010. At step 1030, the system is ready for SEM measurements. Different system parameters are measured at this step. Such parameters are analysed and evaluated at step 1040. If certain condition is not fulfilled (or a predetermined threshold is exceeded) at step 1040, the system proceeds to step 1050 and initializes the maintenance process (i.e. greasing strokes). The maintenance process may be moving the long stroke stage such that rolling elements of the roller bearings make one or more complete turns. Alternatively, the maintenance process may be moving the long stroke stage over all or a substantial part of its movement range in one or both directions of a plane defined by an object held and positioned by the stage apparatus (e.g. x and y directions).

After the maintenance process is completed, new system parameters are measured and evaluated at step 1040. If no threshold is exceeded, the system returns to step 1030 for SEM measurements. Otherwise, another maintenance process will be performed.

To summarize, the impact of fretting corrosion of the roller bearings 424 of the long stroke stage 414 can be reduced by implementing one of or any combination of the anti-fretting function block, the dead-zone function block and the smart greasing mechanism. Some embodiments of the present disclosure enable the long stroke stage 424 to be decoupled from the vacuum chamber 406 so as to prevent micro-movements of the long stroke stage. The risk of fretting corrosion can be further reduced by performing greasing strokes in a smart manner so as to keep the roller bearings sufficiently lubricated.

Further embodiments may be described in the following clauses:

1. A stage apparatus, comprising:
   a short stroke stage;
   a long stroke stage;
   a first sensor configured to measure a position of the short stroke stage with respect to a reference;
   one or more roller bearings configured to support the long stroke stage; and
   a controller for controlling a motion of the long stroke stage,
   wherein said controller is operable such that control of the long stroke stage is decoupled from the reference in at least part of operation of the stage apparatus.

2. A stage apparatus according to clause 1, wherein said controller is operable to selectively decouple control of the long stroke stage from the reference.

3. A stage apparatus according to clause 1 or 2, wherein the reference is subject to movement and said decoupling of control of the long stroke stage from the reference results in a decoupling of control of the long stroke stage from said movement of the reference.

4. A stage apparatus according to clause 3, wherein said movement of the reference results from movement of a chamber in which said stage apparatus is comprised and said decoupling of control of the long stroke stage from said movement of the reference comprises a decoupling of control of the long stroke stage from said movement of the chamber.

5. A stage apparatus according to clause 4, wherein said reference comprises, or is directly or indirectly coupled to, said chamber.

6. A stage apparatus according to any of clauses 3 to 5, wherein said reference comprises, or is directly or indirectly coupled to, a metro frame.

7. A stage apparatus according to clause 6, wherein said movement of the reference results from movement of said metro frame and said decoupling of control of the long stroke stage from said movement of the reference comprises a decoupling of control of the long stroke stage from said movement of the metro frame.

8. A stage apparatus according to any of clauses 3 to 7, wherein said movement of the reference results from movement of a processing unit with which an object held and positioned by said stage apparatus is processed, measured, and/or inspected, and said decoupling of control of the long stroke stage from said movement of the reference comprises a decoupling of control of the long stroke stage from said movement of the processing unit.

9. A stage apparatus according to clause 8, wherein said reference comprises, or is directly or indirectly coupled to, said processing unit.

10. A stage apparatus according to clause 8 or 9, wherein said processing unit is an electron optical system.

11. A stage apparatus according to any preceding clause, wherein said controller is operable such that control of the long stroke stage is decoupled from the reference in the at least part of operation of the stage apparatus when the stage apparatus is located within a measurement range of the first sensor.

12. A stage apparatus according to any preceding clause, wherein the short stroke stage is supported by the long stroke stage.

13. A stage apparatus according to any preceding clause, wherein said controller is operable to switch control between at least a first mode of operation and a second mode of operation, wherein, in the first mode of operation, the controller is operable to:
   control the short stroke stage with reference to said reference; and
   control the long-stroke stage with reference to said short stroke stage.

14. A stage apparatus according to clause 13, wherein the controller is operable to switch control from the first mode of operation to the second mode of operation when it is determined that the stage apparatus is substantially at standstill.

15. A stage apparatus according to clause 14, wherein determining whether the stage apparatus is at standstill comprises determining whether a relative position between the short stroke stage and the long stroke stage does not exceed a threshold offset.

16. A stage apparatus according to clause 15, wherein determining whether the stage apparatus is at standstill further comprises determining whether said relative position between the short stroke stage and the long stroke stage does not exceed said threshold offset for at least a threshold period of time.

17. A stage apparatus according to any of clauses 14 to 16, wherein said switch of control is performed when it is additionally determined that no further movement of the stage apparatus is imminent.

18. A stage apparatus according to clause 17, wherein determining whether no further movement is imminent comprises determining whether a set-point velocity exceeds zero or other threshold value.

19. A stage apparatus according to any of clauses 13 to 18, comprising imposing a delay before switching control from the first mode of operation to the second mode of operation, and/or before switching control from the second mode of operation to the first mode of operation.

20. A stage apparatus according to any of clauses 13 to 19, wherein: said controller is operable such that control of the short-stoke stage and long stroke stage in said first mode of operation each comprises a closed-loop control.

21. A stage apparatus according to clause 20, wherein said controller is operable such that said closed-loop operation of the short-stoke stage and long stroke stage is based on a measured position of, respectively, the short stroke stage with respect to the reference and the long stroke stage with respect to the short stroke stage, said control being based on minimizing an error signal describing a difference between the measured position and a setpoint.

22. A stage apparatus according to any of clauses 13 to 21, wherein said second mode of operation comprises operating said long stroke stage in an open-loop control.

23. A stage apparatus according to any of clauses 13 to 21, wherein said second mode of operation comprises operating said long stroke stage with reference to a reference other than the short stroke stage.

24. A stage apparatus according to clause 23, wherein second mode of operation further comprises operating said short stroke stage with reference to said reference.

25. A stage apparatus according to clause 23, wherein second mode of operation further comprises operating said short stroke stage with reference to the long stroke stage.

26. A stage apparatus according to any of clauses 1 to 12, wherein said controller is operable to:
   control the short stroke stage with reference to said reference; and
   control the long stroke stage with reference to a reference other than the short stroke stage.

27. A stage apparatus according to any of clauses 23 to 26, wherein said reference other than the short stroke stage is located on a baseplate on which the one or more roller bearings are mounted.

28. A stage apparatus according to any of clauses 23 to 27, wherein said controller is operable to compensate for drift between the short stroke stage and the long stroke stage by monitoring said drift and performing an appropriate movement of the short stroke stage and/or the long stroke stage to reduce said drift.

29. A stage apparatus according to any preceding clause, wherein said controller is operable to decouple said control of the long stroke stage from said reference when a measurement signal of a sensor measuring a position of the long stroke stage is below a dead-zone threshold.

30. A stage apparatus according to clause 29, wherein said decoupling of said control of the long stroke stage from said reference is implemented by setting said control of the long stroke stage to an open loop operation when said measured position of the long stroke stage is below said dead-zone threshold.

31. A stage apparatus according to clause 29, wherein said decoupling of said control of the long stroke stage from said reference is implemented by configuring said controller of the long stroke stage such that said controller does not respond to the measurement signal from said sensor when said measured position of the long stroke stage is below said dead-zone threshold.

32. A stage apparatus according to clause 29, wherein said controller is operable to determine a dynamic dead-zone threshold based on one or more of: a control mode being operated in, the magnitude of said movement of said reference, a measurement recipe relating to a measurement being performed using the stage apparatus, a particular use-case and one or more environmental factors.

33. A stage apparatus according to clause 32, wherein said controller is operable such that, if said movement is determined to be greater than the dead-zone threshold, the dead-zone threshold is increased.

34. A stage apparatus according to any preceding clause, comprising:
   a second sensor for performing second measurements of the relative position of the short stroke stage and long stroke stage; and
   a third sensor for performing third measurements of a position of the long stroke stage with respect to a base plate.

35. A stage apparatus according to any preceding clause, wherein the controller is operable to evaluate the status of the stage apparatus; and decide to perform a greasing maintenance action based on said evaluation,
wherein said greasing maintenance action comprises moving said long stroke stage to distribute grease over said roller bearings.

36. A stage apparatus according to clause 35, wherein said greasing maintenance action comprises moving said long stroke stage such that one or more rolling elements of the roller bearings make one or more complete turns.

37. A stage apparatus according to clause 35 or 36, wherein said greasing maintenance action comprises moving said long stroke stage over all or a substantial part of its movement range in one or both directions of a plane defined by an object held and positioned by the stage apparatus.

38. A stage apparatus according to any of clauses 35 to 37, wherein said evaluating the status of the stage apparatus comprises taking account one or more of a standstill time of the long stroke stage, the amplitudes of movements of the long stroke stage and/or the one or more roller bearings, and a set-point of closed control loops.

39. A stage apparatus, comprising:
a short stroke stage;
a long stroke stage;
one or more roller bearings for supporting the long stroke stage;
and a controller operable to evaluate the status of the stage apparatus;
wherein the controller is operable to evaluate the status of the stage apparatus; and
decide to perform a greasing maintenance action based on said evaluation, wherein said greasing maintenance action comprises moving said long stroke stage to distribute grease over said roller bearings.

40. A stage apparatus according to clause 39, where said greasing maintenance action comprises moving said long stroke stage such that one or more rolling elements of the roller bearings make one or more complete turns.

41. A stage apparatus according to clause 39 or 40, wherein said greasing maintenance action comprises moving said long stroke stage over all or a substantial part of its movement range in one or both directions in a plane parallel to an object plane defined by an object held and positioned by the stage apparatus.

42. A stage apparatus according to any of clauses 39 to 41, wherein said evaluating the status of the stage apparatus comprises taking account one or more of a standstill time of the long stroke stage, the amplitudes of movements of the long stroke stage and/or the one or more roller bearings, and a set-point of closed control loops.

43. A metrology apparatus comprising a stage apparatus according to any preceding clause for holding and positioning an object.

44. A metrology apparatus according to clause 43, comprising a scanning electron microscopy apparatus being operable to image one or more features on an object retained by said object support.

45. An inspection apparatus comprising a stage apparatus according to any of clauses 1 to 42, for holding and positioning an object.

46. An inspection apparatus according to clause 45, comprising a scanning electron microscopy apparatus being operable to image one or more features on an object retained by said object support.

47. A lithography apparatus comprising a stage apparatus according to any of clauses 1 to 42, for holding and positioning an object.

48. An apparatus comprising a stage apparatus according to any of clauses 1 to 42, for holding and positioning an object, wherein the apparatus is a particle beam apparatus, an electron beam apparatus, a scanning electron microscope, an electron beam direct writer, an electron beam projection lithography apparatus, an electron beam inspection apparatus, an electron beam defect verification apparatus, an electron beam metrology apparatus, a lithographic apparatus, a metrology apparatus, or a vacuum apparatus.

49. A stage apparatus, comprising:
a short stroke stage;
a long stroke stage;
a first sensor configured to measure a position of the short stroke stage with respect to a reference arranged not on the short stroke stage and not on the long stroke stage;
one or more roller bearings configured to support the long stroke stage; and
a controller for controlling a motion of the long stroke stage and a motion of the short stroke stage for following movement of the reference at least partly based on measurement from the first sensor,
wherein said controller is operable such that control of the long stroke stage is decoupled from said movement of the reference in at least part of operation of the stage apparatus for reducing debris generation of the one or more roller bearings 50. A stage apparatus, comprising:
a short stroke stage;
a long stroke stage;
a first sensor configured to measure a position of the short stroke stage with respect to a reference arranged not on the short stroke stage or not on the long stroke stage;
one or more roller bearings configured to support the long stroke stage; and
a controller for controlling a motion of the long stroke stage and a motion of the short stroke stage,
wherein the reference is subject to movement, and
wherein said controller is operable such that control of the short stroke stage is coupled to said movement of the reference based on measurement from the first sensor,
and control of the long stroke stage is decoupled from said movement of the reference in at least part of operation of the stage apparatus for reducing debris generation of the one or more roller bearings.

The stage apparatuses disclosed herein find applicability within, and may comprise part of, a particle beam apparatus, an e-beam apparatus, an e-beam inspection apparatus, a metrology apparatus (including a scatterometer apparatus), a vacuum apparatus, reticle inspection tool or a lithography apparatus for example. In the latter two examples, the object may be a reticle (or mask), rather than a substrate, for patterning a beam in a lithographic apparatus), the stage apparatus therefore being a reticle stage.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

Specific orientations have been given when describing the relative arrangement of components. It will be appreciated that these orientations are given purely as examples and are not intended to be limiting. For example, the xy-stage of the positioning device 180 has been described as being operable to position an object in a substantially horizontal plane. The xy-stage of the positioning device 180 may alternatively be operable to position an object in a vertical plane or in an oblique plane. Orientations of components may vary from the orientations described herein whilst maintaining their intended functional effect of said components.

The breadth and scope of the present disclosure should not be limited by any of the above-described exemplary embodiments, but should be defined only in accordance with the following claims and their equivalents.

The invention claimed is:

1. A stage apparatus, comprising:
a short stroke stage;
a long stroke stage;
a sensor configured to measure a position of the short stroke stage with respect to a measurement reference, arranged on a frame of a system configured to use the stage apparatus to position an object, not on the short stroke stage and not on the long stroke stage;
one or more roller bearings configured to support the long stroke stage; and
a controller for controlling a motion of the long stroke stage and a motion of the short stroke stage for following movement of the measurement reference based on a position measurement from the sensor, wherein the controller is configured to control the motion of the long stroke stage according to selectable modes of operation to reduce debris generation by the one or more roller bearings, wherein the selectable modes comprise:
a coupled mode, wherein the control of the long stroke stage is coupled to the movement of the measurement reference based on the position measurement from the sensor; and
a decoupled mode, wherein the control of the long stroke stage is decoupled from the movement of the measurement reference to reduce a movement of the one or more roller bearings.

2. The stage apparatus as claimed in claim 1, wherein the controller is further operable to switch control from the coupled mode to the decoupled mode based on a determination that the stage apparatus is substantially stationary.

3. The stage apparatus as claimed in claim 2, wherein the determination that the stage apparatus is substantially stationary comprises:
a determination that a relative position between the short stroke stage and the long stroke stage does not exceed a threshold offset, or
a determination that the relative position between the short stroke stage and the long stroke stage does not exceed the threshold offset for a threshold period of time.

4. The stage apparatus as claimed in claim 3, further comprising:
a second sensor configured to perform measurements of the relative position of the short stroke stage and the long stroke stage; and
a third sensor configured to perform measurements of a position of the long stroke stage with respect to a base plate.

5. The stage apparatus as claimed in claim 1, wherein the decoupled mode comprises operating the long stroke stage in an open-loop control.

6. The stage apparatus as claimed in claim 1, wherein the decoupled mode comprises operating the long stroke stage with reference to a measurement reference different from the short stroke stage.

7. The stage apparatus as claimed in claim 1, wherein:
the frame of the system is coupled to a source of vibration;
the movement of the measurement reference is based on the vibration; and
the decoupling of control of the long stroke stage from the movement of the measurement reference comprises a decoupling of control of the long stroke stage from the vibrations.

8. The stage apparatus as claimed in claim 1, wherein:
the system is a wafer processing unit with which the object held and positioned by the stage apparatus is processed, measured, or inspected;
the movement of the measurement reference is based on a movement of the wafer processing unit; and
decoupling of the control of the long stroke stage from the movement of the measurement reference comprises a decoupling of control of the long stroke stage from the movement of the wafer processing unit.

9. The stage apparatus as claimed in claim 8, wherein the measurement reference is directly or indirectly coupled to the wafer processing unit.

10. The stage apparatus as claimed in claim 8, wherein the wafer processing unit comprises an electron optical system.

11. The stage apparatus as claimed in claim 1, wherein the controller is further configured such that the control of the long stroke stage is decoupled from the measurement reference when the stage apparatus is located within a measurement range of the sensor.

12. The stage apparatus as claimed in claim 1, wherein the controller is further configured to:
control the short stroke stage with reference to the measurement reference; and
control the long stroke stage with reference to a reference different from the short stroke stage.

13. The stage apparatus as claimed in claim 12, wherein the reference different from the short stroke stage is located on a baseplate on which the one or more roller bearings are mounted.

14. The stage apparatus as claimed in claim 12, wherein the controller is further configured to compensate for a drift between the short stroke stage and the long stroke stage by:
monitoring the drift; and
performing an appropriate movement of the short stroke stage or the long stroke stage to reduce the drift.

15. The stage apparatus as claimed in claim 1, wherein the controller is further configured to decouple the control of the long stroke stage from the measurement reference when a measurement signal of a sensor measuring a position of the long stroke stage is below a dead-zone threshold.

16. The stage apparatus as claimed in claim 15, wherein the controller is further configured to determine a dynamic dead-zone threshold based on one or more of: a control mode being operated in, a magnitude of a movement of the reference, a measurement recipe relating to a measurement being performed using the stage apparatus, a use-case or one or more environmental factors.

17. The stage apparatus of claim 1, wherein the controller is further configured to;
   evaluate a status of the stage apparatus; and
   perform a greasing maintenance action based on the evaluation, wherein the greasing maintenance action comprises moving the long stroke stage to distribute grease over the one or more roller bearings.

18. The stage apparatus as claimed in claim 17, wherein the evaluation of the status of the stage apparatus is based on one or more of a stationary time of the long stroke stage, amplitudes of movements of the long stroke stage or the one or more roller bearings, or a set-point of closed control loops.

19. An apparatus, comprising:
   a stage apparatus configured to position an object, the stage apparatus comprising:
      a short stroke stage;
      a long stroke stage;
      a sensor configured to measure a position of the short stroke stage with respect to a measurement reference arranged on metrology frame, not on the short stroke stage and not on the long stroke stage;
      one or more roller bearings configured to support the long stroke stage; and
      a controller for controlling a motion of the long stroke stage and a motion of the short stroke stage for following movement of the measurement reference based on a position measurement from the sensor, wherein the controller is configured to control the motion of the long stroke stage according to selectable modes of operation to reduce debris generation by the one or more roller bearings, wherein the selectable modes comprise:
         a coupled mode, wherein the control of the long stroke stage is coupled to the movement of the measurement reference based on the position measurement from the sensor; and
         a decoupled mode, wherein the control of the long stroke stage is decoupled from the movement of the measurement reference to reduce a movement of the one or more roller bearings.

* * * * *